(12) United States Patent
Bae et al.

(10) Patent No.: US 9,775,236 B2
(45) Date of Patent: Sep. 26, 2017

(54) METHOD OF MANUFACTURING A TRANSPARENT SUBSTRATE

(71) Applicant: LG CHEM, LTD., Seoul (KR)

(72) Inventors: Sung-Hak Bae, Daejeon (KR); Sang-Choll Han, Daejeon (KR); Byong-Mook Kim, Daejeon (KR)

(73) Assignee: LG CHEM, LTD., Seoul (KR)

(*) Notice: Subject to any disclaimer, the term of this patent is extended or adjusted under 35 U.S.C. 154(b) by 451 days.

(21) Appl. No.: 14/371,387

(22) PCT Filed: Mar. 7, 2014

(86) PCT No.: PCT/KR2014/001906
§ 371 (c)(1),
(2) Date: Jul. 9, 2014

(87) PCT Pub. No.: WO2014/137192
PCT Pub. Date: Sep. 12, 2014

(65) Prior Publication Data
US 2016/0278205 A1 Sep. 22, 2016

(30) Foreign Application Priority Data

Mar. 7, 2013 (KR) .......... 10-2013-0024661
Mar. 7, 2014 (KR) .......... 10-2014-0027237

(51) Int. Cl.
H02K 1/02 (2006.01)
H05K 1/02 (2006.01)
(Continued)

(52) U.S. Cl.
CPC ............. *H05K 1/0296* (2013.01); *H05B 3/12* (2013.01); *H05B 3/84* (2013.01); *H05K 1/0274* (2013.01);
(Continued)

(58) Field of Classification Search
CPC .......... H01L 21/00; H01L 21/02; H05K 3/00; H05K 1/0274; H05K 1/0296;
(Continued)

(56) References Cited

U.S. PATENT DOCUMENTS

2002/0113547 A1 8/2002 Ishikawa et al.
2003/0164243 A1 9/2003 Arakawa et al.
(Continued)

FOREIGN PATENT DOCUMENTS

CN 1440234 A 9/2003
EP 159828 A1 * 10/1985
(Continued)

*Primary Examiner* — Carl Arbes
(74) *Attorney, Agent, or Firm* — Dentons US LLP

(57) ABSTRACT

The present disclosure relates to a transparent substrate including: a resin pattern layer including a plurality of grooves respectively including side surfaces and a bottom surface; and, a conductive layer formed within the grooves, wherein a line width of the conductive layer is 0.1 μm to 3 μm and an average height of the conductive layer is 5% to 50% of a maximum depth of each of the grooves, and a manufacturing method thereof, such that simplicity in a manufacturing process and a consecutive process are enabled, manufacturing costs are inexpensive, and a transparent substrate having superior electrical conductivity and transparency characteristics is manufactured.

38 Claims, 6 Drawing Sheets (A)

(B)

(C)

(D)

(51) Int. Cl.
*H05K 3/04* (2006.01)
*H05B 3/12* (2006.01)
*H05B 3/84* (2006.01)
*H05K 1/03* (2006.01)
*H05K 1/09* (2006.01)
*H05K 3/00* (2006.01)
*H05K 3/14* (2006.01)
*H05K 3/38* (2006.01)
*G03F 7/00* (2006.01)

(52) U.S. Cl.
CPC ............ *H05K 1/0313* (2013.01); *H05K 1/09* (2013.01); *H05K 3/0023* (2013.01); *H05K 3/0044* (2013.01); *H05K 3/04* (2013.01); *H05K 3/045* (2013.01); *H05K 3/146* (2013.01); *H05K 3/38* (2013.01); *G03F 7/00* (2013.01); *H05B 2203/017* (2013.01); *H05K 2201/0108* (2013.01); *H05K 2201/0129* (2013.01); *H05K 2201/0317* (2013.01); *H05K 2201/09036* (2013.01); *H05K 2203/0108* (2013.01)

(58) Field of Classification Search
CPC ...... H05K 1/0313; H05K 1/09; H05K 3/0023; H05K 3/0044; H05K 3/04; H05K 3/045; H05K 3/146; H05K 3/38; H05K 2201/0108; H05K 2201/0129; H05K 2201/0317; H05K 2201/09035; H05K 2203/0108; G03F 7/00; H05B 3/12; H05B 3/84; H05B 2203/017
See application file for complete search history.

(56) References Cited

U.S. PATENT DOCUMENTS

| | | |
|---|---|---|
| 2010/0021695 A1 | 1/2010 | Naoyuki et al. |
| 2011/0309385 A1 | 12/2011 | Nendai |
| 2012/0327021 A1 | 12/2012 | Ryu et al. |

FOREIGN PATENT DOCUMENTS

| | | |
|---|---|---|
| JP | 2002-246174 A | 8/2002 |
| JP | 2006-330616 A | 12/2006 |
| JP | 2008-277202 A | 11/2008 |
| KR | 10-2012-0014302 A | 2/2012 |
| KR | 10-2012-0064648 A | 6/2012 |
| WO | 2011/021470 A1 | 2/2011 |

* cited by examiner

[Figure 1]
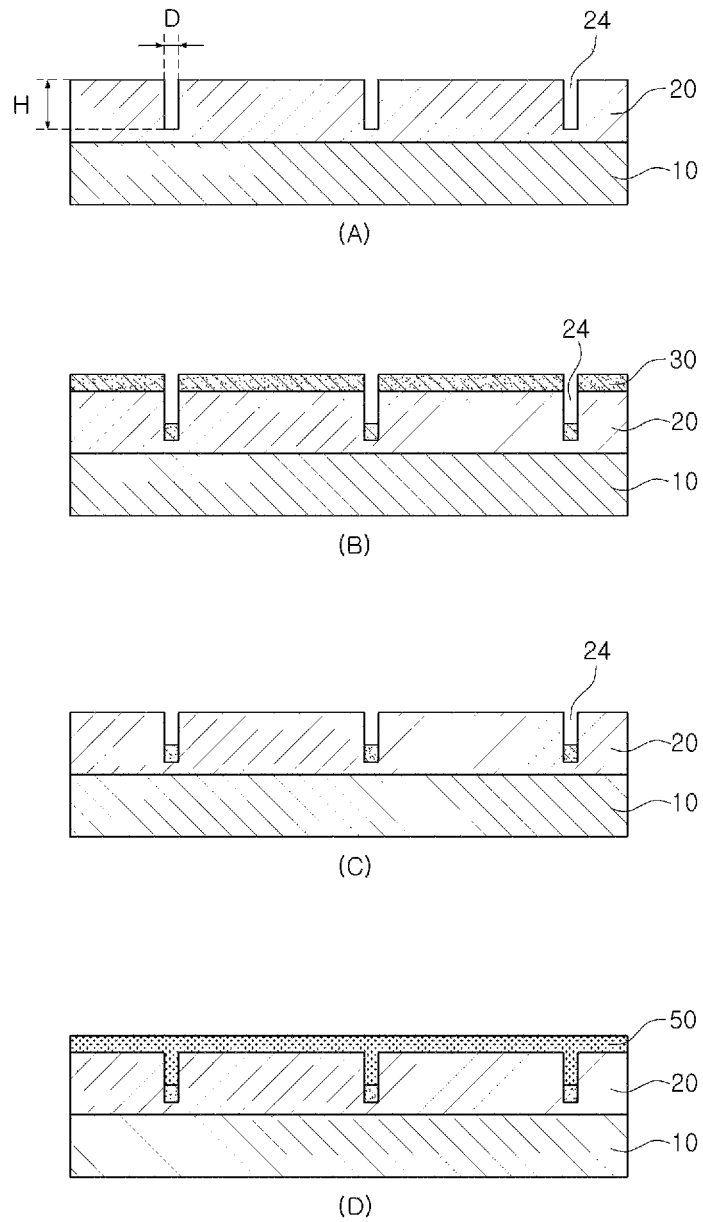

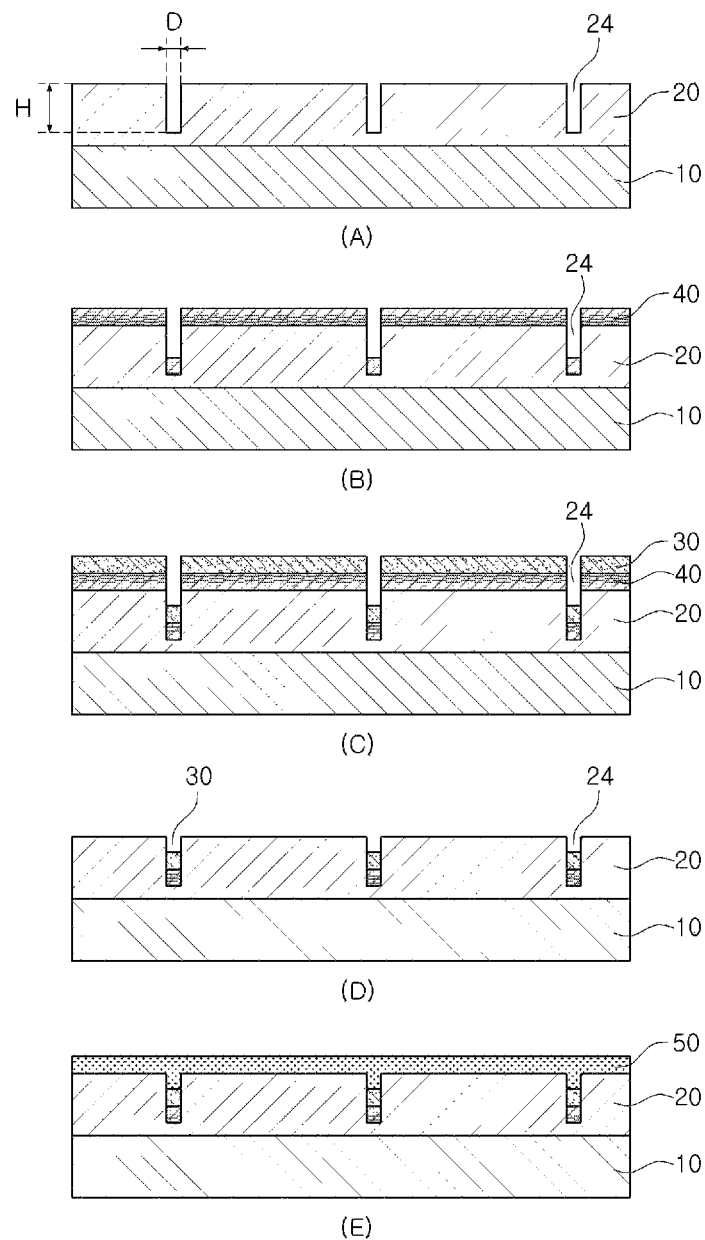
[Figure 2]

[Figure 3]
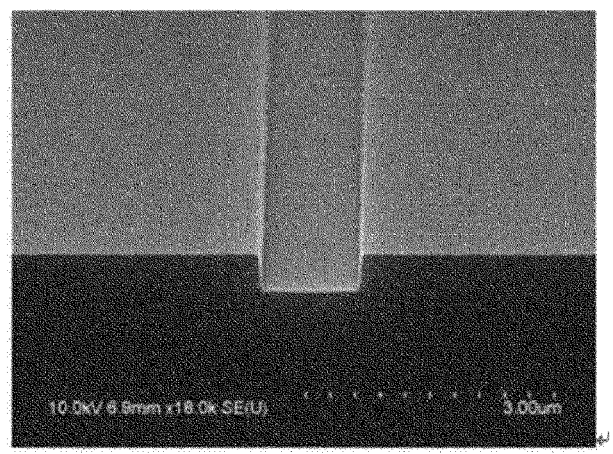

[Figure 4]
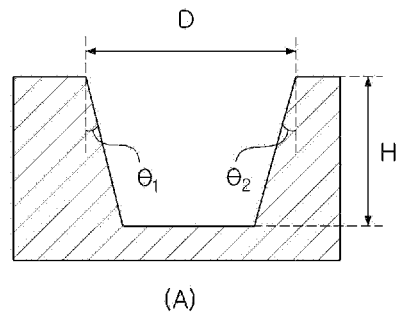
(A)
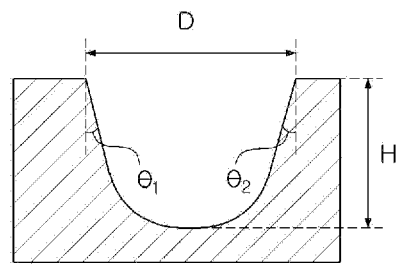
(B)
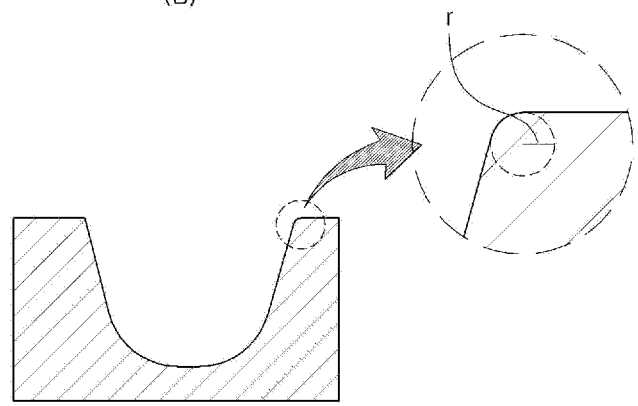
(C)

[Figure 5]
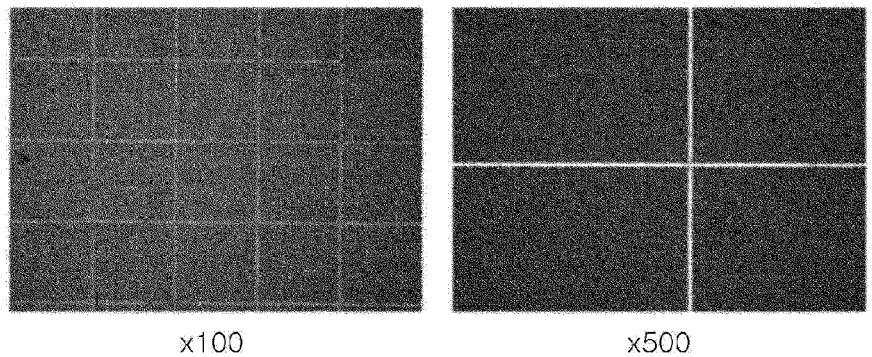
x100          x500
[Figure 6]
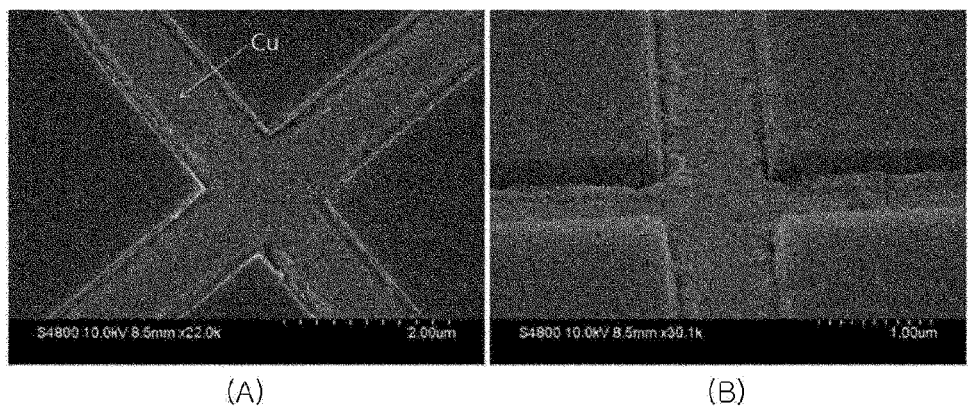
(A)          (B)
[Figure 7]
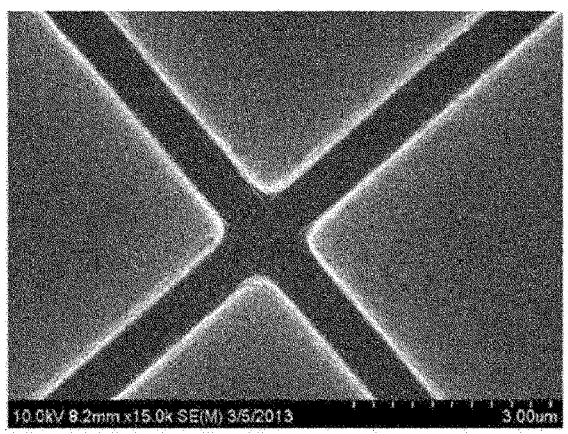

[Figure 8]
[Figure 9]
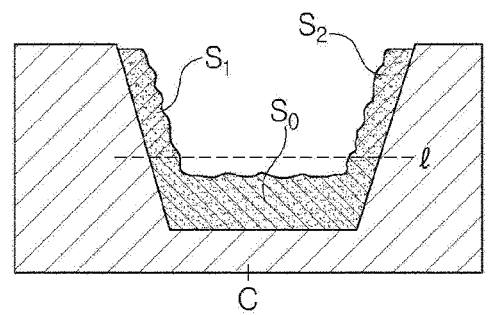

METHOD OF MANUFACTURING A TRANSPARENT SUBSTRATE

This application is a 35 USC §371 National Stage entry of International Application No. PCT/KR2014/001906, filed Mar. 7, 2014, and claims priority to Korean Application Nos. 10-2013-0024661, filed Mar. 7, 2013 and 10-2014-0027237, filed Mar. 7, 2014, all of which are hereby incorporated by reference in their entirety.

TECHNICAL FIELD

The present disclosure relates to a transparent substrate and a manufacturing method thereof, and more particularly, to a transparent substrate including a fine metal line having a line width of 3 µm or less and providing superior electrical conductivity and transparency characteristics, and a manufacturing method thereof.

BACKGROUND ART

Conductive substrates having fine conductive patterns formed on a polymer film or a glass substrate have been used in various fields of applications such as electromagnetic wave-shielding filters, heating wire glass, touch panels, liquid crystal displays and the like, within various fields of application. Meanwhile, in conductive substrates used in display devices or touch panels, in a case in which a line width of a conductive pattern exceeds 3 µm, the conductive pattern may be easily visually discernible from the outside of the substrate due to a difference in reflectance between a conductive pattern layer and the substrate, thereby leading to a deterioration in display quality. Therefore, it is necessary to control the line width of the conductive pattern to be decreased. However, it may be difficult to implement such a fine line width using a manufacturing method of a conductive substrate according to the related art.

More specifically, in order to form a conductive substrate having conductive fine patterns formed therein according to the related art, a method of forming a groove in a glass substrate or a polymer substrate, filling the groove with a conductive material through wet coating or the like, and removing the conductive material coated on portions of the substrate other than that present in the groove using a doctor blade method or the like, a method of filling a groove with metal particles, metallic oxides and the like, and performing compression thereon by applying heat and/or pressure thereto, and the like, may be used.

However, in a wet coating method, a resin containing conductive polymers or conductive particles, or the like may be used as a conductive material. Here, in a case in which conductivity of the resin is significantly low as compared to that of a solid metal and a process rate thereof is increased, a non-filled region in the groove may be easily generated, thereby leading to an increase in a defect rate. In addition, in order to implement a fine line width of 3 µm or less, a conductive material filled in a groove needs to have a significantly fine nano-size, but it may be practically unfeasible to reduce a size of the conductive material in such a manner.

Meanwhile, in the case of a method of compressing metal particles or metal oxide particles by applying heat and/or pressure thereto, pattern deformation may easily occur due to heat and/or pressure to deteriorate the degree of precision, thereby causing limitations in the formation of fine patterns.

Further, in addition to the methods described above, a manufacturing method of a conductive substrate having conductive fine patterns formed therein through a scheme of printing or plating fine patterns using a conductive ink on the substrate, has been suggested. However, in the scheme of performing printing using a conductive ink, in order to realize a fine line width, a droplet size of the conductive ink needs to be decreased to a nano-size level. However, since it may be practically difficult to implement ink droplets sizes in such a manner, the scheme of performing printing using a conductive ink may be inappropriate for forming patterns having a line width of 3 µm or less. In addition, in the case of the plating scheme, since it may be difficult to selectively perform plating only on a groove, a metal layer formed on a region other than the groove needs to be removed through a polishing operation using polishing particles after the plating. However, in this case, since it may be difficult to apply a consecutive process such as a roll-to-roll process thereto, a relatively long manufacturing time may be required, and relatively cumbersome processes may be caused.

DISCLOSURE

Technical Problem

An aspect of the present disclosure provides a manufacturing method of a transparent substrate in which a line width of conductive patterns is 3 µm or less and superior conductivity and transparency characteristics are exhibited, the manufacturing method allowing for simplicity in a manufacturing process and enabling a consecutive process such as a roll-to-roll process to be used therein.

Technical Solution

According to an aspect of the present disclosure, a manufacturing method of a transparent substrate may include: forming a resin pattern layer including a plurality of grooves respectively including a side surface and a bottom surface; forming a conductive layer by depositing a metal on the resin pattern layer, while an average height of the conductive layer is controlled to be 5% to 50% of a maximum depth of each of the grooves and a metal deposition angle is controlled to be within a range of −15° to 15° with respect to a direction of a normal line of the resin pattern layer; and physically removing the conductive layer from remaining regions of the resin pattern layer, other than portions of the conductive layer present in the grooves.

A maximum width of the groove may be 0.1 µm to 3 µm, and the maximum depth of the groove may be 0.2 times to 2 times the maximum width of the groove. The side surface of the groove may have an angle of inclination ranging from 0° to 15°, with respect to a vertical direction. A radius of curvature of an upper edge on the side surface of the groove may be equal to or less than 0.3 times the maximum depth of the groove. A total area of bottom surfaces of the grooves may be 0.1% to 5% of an overall cross-sectional area of the resin pattern layer.

The forming of the resin pattern layer including the plurality of grooves may be performed by an imprinting method, a photolithography method, or an electron beam lithography method.

The forming of the conductive layer may be performed such that a thickness of the conductive layer deposited on the side surface of the groove is 25% or less of the average height of the conductive layer.

The physically removing the conductive layer may be performed by a scraping method, a detaching method or a combination thereof. The physically removing the conductive layer may be performed by a method of polishing and removing the conductive layer, using a melamine foam or a fabric having a rough surface.

The forming of the conductive layer may further include forming an adhesion controlling layer on the resin pattern layer prior to the deposition of the metal, if necessary. The forming of the adhesion controlling layer may be performed by a chemical vapor deposition method or a physical vapor deposition method. A deposition angle of a material for forming the adhesion controlling layer may be within a range of approximately −15° to 15° with respect to the direction of the normal line of the resin pattern layer.

The forming of the conductive layer may further include forming a blackening layer. The forming of the blackening layer may be performed by a chemical vapor deposition method or a physical vapor deposition method. A deposition angle of a material for forming the blackening layer may be within a range of approximately −15° to 15° with respect to the direction of the normal line of the resin pattern layer.

According to an aspect of the present disclosure, the manufacturing method may further include: planarizing the resin pattern layer after the physically removing the conductive layer.

According to another aspect of the present disclosure, a transparent substrate may include: a resin pattern layer including a plurality of grooves respectively including side surfaces and a bottom surface; and a conductive layer formed within the grooves, wherein a line width of the conductive layer is 0.1 μm to 3 μm and an average height of the conductive layer is 5% to 50% of a maximum depth of each of the grooves.

Meanwhile, in the transparent substrate according to another aspect of the present disclosure, when an absolute value of an angle of inclination of one side surface of the groove with respect to a vertical direction is denoted by $\theta_1$ and an absolute value of an angle of inclination of another side surface of the groove with respect to the vertical direction is denoted by $\theta_2$, in the case of tan θ1+tan θ2=0, a vertical section of the conductive layer may satisfy the following Equations 1 and 2:

$$0 \leq S_1 D^2/(S_0 HD - S_0^2) \leq 0.3 \quad \text{[Equation 1]}$$

$$0 \leq S_2 D^2/(S_0 HD - S_0^2) \leq 0.3, \quad \text{[Equation 2]}$$

where H is the maximum depth of the groove, and D is a maximum width of the groove, and when the average height of the conductive layer is defined as h and a horizontal line passing through a point disposed at a height of 1.2h from a central point of the groove is defined as a reference line, area $S_0$ is a cross-sectional area of the conductive layer disposed below the reference line, area $S_1$ is a cross-sectional area of the conductive layer attached to one side surface of the groove among portions of the conductive layer disposed above the reference line, and area $S_2$ is a cross-sectional area of the conductive layer attached to another side surface of the groove among the portions of the conductive layer disposed above the reference line.

Meanwhile, in the transparent substrate according to another aspect of the present disclosure, when an absolute value of an angle of inclination of one side surface of the groove with respect to a vertical direction is denoted by $\theta_1$ and an absolute value of an angle of inclination of another side surface of the groove with respect to the vertical direction is denoted by $\theta_2$, in the case of tan $\theta_1$+tan $\theta_2$>0, a vertical section of the conductive layer may satisfy the following Equations 3 and 4:

$$0 \leq S_1(\tan\theta_1+\tan\theta_2)\cos\theta_1/[\{2D-H(\tan\theta_1+\tan\theta_2)\}T_0-2S_0] \leq 0.3 \quad \text{[Equation 3]}$$

$$0 \leq S_2(\tan\theta_1+\tan\theta_2)\cos\theta_2/[\{2D-H(\tan\theta_1+\tan\theta_2)\}T_0-2S_0] \leq 0.3, \quad \text{[Equation 4]}$$

where $T_0$ is a value defined by the following [Equation 5], $$T_0 = [H(\tan\theta_1+\tan\theta_2)-D+\{(D-H(\tan\theta_1+\tan\theta_2))^2+2S_0(\tan\theta_1+\tan\theta_2)\}^{0.5}]/(\tan\theta_1+\tan\theta_2), \quad \text{[Equation 5]}$$

where H is the maximum depth of the groove, and D is a maximum width of the groove, and when the average height of the conductive layer is defined as h and a horizontal line passing through a point disposed at a height of 1.2h from a central point of the groove is defined as a reference line, area $S_0$ is a cross-sectional area of the conductive layer disposed below the reference line, area $S_1$ is a cross-sectional area of the conductive layer attached to one side surface of the groove among portions of the conductive layer disposed above the reference line, and area $S_2$ is a cross-sectional area of the conductive layer attached to another side surface of the groove among the portions of the conductive layer disposed above the reference line.

Meanwhile, the transparent substrate according to another aspect of the present disclosure may further include a planarized layer on an upper portion of the conductive layer. In this case, a difference in indices of refraction between the planarized layer and a material forming the resin pattern layer may be 0.3 or less.

An opening ratio of the transparent substrate may be 95% to 99.9%, and sheet resistance of the transparent substrate may be 0.01Ω/□ to 100Ω/□, which have superior transparency and conductivity characteristics.

Advantageous Effects

In a manufacturing method of a transparent substrate according to exemplary embodiments of the present disclosure, a significantly fine metal line having a line width of 3 μm or less may be formed and accordingly, a deterioration in transparency due to the reflection of the fine metal line may be significantly reduced, such that a transparent substrate having superior transparency may be manufactured. Therefore, the transparent substrate manufactured according to exemplary embodiments of the present disclosure may be usefully employed in the field of displays such as touch panels or transparent organic light emitting diodes (OLEDs).

Further, according to the manufacturing method of the transparent substrate, since a transparent substrate including a conductive layer may be manufactured through a consecutive process such as a roll-to-roll process, productivity thereof may be excellent and manufacturing costs required therefor may be relatively low. Moreover, the manufacturing method may have environmentally friendly characteristics capable of significantly decreasing the generation of chemical waste products through physical metal removal.

DESCRIPTION OF DRAWINGS

FIGS. 1 and 2 are views illustrating various implementation examples of a manufacturing method of a transparent substrate including a conductive layer according to an exemplary embodiment of the present disclosure.

FIG. 3 is an image obtained by imaging a groove according to an exemplary embodiment of the present disclosure, using a scanning electron microscope (SEM).

FIG. 4 is views illustrating examples of a cross-sectional shape of a groove in the transparent substrate according to an exemplary embodiment of the present disclosure.

FIG. 5 is images obtained by imaging the transparent substrate including the conductive layer according to an exemplary embodiment of the present disclosure, using an optical microscope.

FIG. 6 is images obtained by imaging a transparent substrate manufactured according to Inventive Example of the present disclosure.

FIG. 7 is an image obtained by imaging a transparent substrate according to Comparative Example 1 of the present disclosure.

FIG. 8 is an image obtained by imaging a transparent substrate according to Comparative Example 2 of the present disclosure.

FIG. 9 is a view illustrating a vertical section of the conductive layer of the transparent substrate according to an exemplary embodiment of the present disclosure.

BEST MODE

Hereinafter, exemplary embodiments of the present disclosure will be described in detail with reference to the accompanying drawings. The following drawings may, however, be provided to explain the present disclosure in detail and be illustrated by way of example. Thus, the present disclosure should not be construed as being limited to the specific embodiments set forth herein. Meanwhile, in the drawings, the same reference numerals will be used throughout to designate the same or like elements, and respective elements illustrated in the drawings may be exaggerated, downsized or omitted for more comprehensive understanding of the present disclosure.

As a result of repeated research undertaken in order to manufacture a transparent substrate having superior conductivity and transparency characteristics, the inventors of the present disclosure found that during the formation of a conductive layer, an average height of the conductive layer is controlled to be 50% or less of a depth of a groove and a metal deposition angle is controlled to be within a range of −15° to 15° with respect to a direction of a normal line of a resin pattern layer, such that a transparent substrate including a conductive layer having a line width of 3 μm or less may be manufactured, and then, completed the present disclosure.

More particularly, an exemplary embodiment of the present disclosure relates to a manufacturing method of a transparent substrate, including: forming a resin pattern layer including a plurality of grooves respectively having side surfaces and a bottom surface; forming a conductive layer by depositing a metal on the resin pattern layer, while an average height of the conductive layer is controlled to be 5% to 50% of a maximum depth of each of the grooves and a metal deposition angle is controlled to be within a range of −15° to 15° with respect to a direction of a normal line of the resin pattern layer; and physically removing the conductive layer from remaining regions of the resin pattern layer, other than portions of the conductive layer present in the grooves.

As illustrated in FIG. 1, the manufacturing method of the transparent substrate according to the exemplary embodiment of the present disclosure may include: forming a resin pattern layer 20 including a plurality of grooves 24 (see FIG. 1(A)), forming a conductive layer 30 on the resin pattern layer 20 (see FIG. 1(B)), and physically removing the conductive layer 30 from remaining regions of the resin pattern layer 20, other than portions of the conductive layer 30 present in the grooves 24 (see FIG. 1(C)).

First, the resin pattern layer 20 including the plurality of grooves 24 may be formed. In this case, as illustrated in FIG. 1, the resin pattern layer 20 may be formed on a base member 10, but the forming of the resin pattern layer 20 is not limited thereto. The resin pattern layer 20 may also be formed without using a separate base member. Meanwhile, a base member able to be used at the time of forming the resin pattern layer 20 on the base member 10 is not particularly limited, but may be formed of a transparent material in that the base member may not be separated from the resin pattern layer 20 to thereby be used, after the forming of the conductive layer. For example, the base member 10 may be a glass substrate, a transparent polymer film or the like. The polymer film may be, for example, a polyethylene terephthalate film, a polycarbonate film, a polyethylene naphthalene film, a polyimide film, a cellulose film, or the like.

The resin pattern layer 20 may be formed by, for example, forming a resin composition layer on the transparent base member 10, and subsequently, patterning the plurality of grooves 24 using, for example, a resin patterning method such as an imprinting method, a photolithography method, or an electron beam lithography method, commonly known in the technical field. A formation method of the resin pattern layer 20 is not particularly limited. Among these, particularly, the imprinting method may be preferably used in consideration of simplicity in a process, manufacturing costs, and the like.

Meanwhile, as the resin pattern layer 20, a variety of resins commonly known in the technical field may be used and a material of the resin pattern layer 20 is not particularly limited. For example, in the exemplary embodiment of the present disclosure, the resin pattern layer 20 may be formed of an active energy ray-curable resin, a thermosetting resin, a conductive polymer resin, or a combination thereof, and examples thereof may contain urethane acrylate, epoxy acrylate, ester acrylate, polydimethylsiloxane, polyacetylene, polyparaphenylene, polyaniline, polypyrrole, and the like.

Meanwhile, the grooves 24, spaces provided to form the conductive layer, may be engraved structures including side surfaces and bottom surfaces and having stripe shapes, as illustrated in FIG. 3. Meanwhile, in an exemplary embodiment of the present disclosure, the resin pattern layer may include the plurality of grooves 24 and preferably, a plurality of grooves extended in one direction and a plurality of grooves extended in another direction may intersect with each other in a lattice manner.

Meanwhile, a shape of each of the grooves 24 in a cross-section taken in a vertical direction (hereinafter, referred to as "a vertical section") with respect to a substrate plane is not particularly limited. The vertical section of the groove 24 may have a quadrangular shape, a reversed trapezoidal shape, a curved shape, a circular shape, an oval shape, a polygonal shape or a combined shape thereof. In FIGS. 4(A) to 4(C), various cross-sectional shapes of the groove according to an exemplary embodiment of the present disclosure are exemplified. The vertical sectional shape of the groove 24 may be a reversed trapezoidal shape as illustrated in FIG. 4(A). As illustrated in FIG. 4(B), the side surfaces of the groove 24 may be formed in a similar manner to side surfaces of a reversed trapezoid, while the bottom surface of the groove 24 may be curved in the vertical section thereof. As illustrated in FIG. 4(C), an upper edge on the side surface of the groove 24 may have a rounded shape in the vertical section thereof. As described above, in an exemplary embodiment of the present disclosure, the shape of the groove is not particularly limited. However, in a case in which a width of an upper region of the groove is smaller than that of a lower region of the groove, pattern formation may be difficult, such that the groove may preferably be formed such that a width of an upper portion of the groove is not smaller than that of a lower portion of the groove. That is, a width of the highest portion of the groove may be formed to be equal to or greater than a width of the lowest portion of the groove.

In addition, the side surfaces of the groove may be formed to have an angle of inclination ranging from 0° to 15°, preferably, 0° to 10°, more preferably, 1° to 5° with respect to a vertical direction. In a case in which an angle at which the side surfaces are inclined with respect to the vertical direction is less than 0°, a width of a lower surface of the groove is greater than that of an upper surface of the groove and consequently, adhesion between a mold and the resin may be increased during a pattern formation process to distort a shape of the groove or a process rate may be decreased. In a case in which the angle at which the side surfaces are inclined with respect to the vertical direction is greater than 15°, an amount of a metal deposited on the side surfaces of the groove may be increased during a conductive layer deposition process, thereby causing a defect in which the conductive layer present in the grooves may be simultaneously removed at the time of physically removing the conductive layer from remaining regions of the resin pattern layer, other than a portion of the conductive layer present in the groove. Meanwhile, according to an exemplary embodiment of the present disclosure, the groove may have two side surfaces and angles of inclination of the both side surfaces may be the same each other or different from each other.

Meanwhile, according to an exemplary embodiment of the present disclosure, the groove may be formed such that a maximum depth H thereof may be approximately 0.2 times to 2 times, preferably, approximately 0.7 times to 1 time a maximum width of the groove. In this case, the maximum depth H refers to a distance from the lowest point of the groove to the highest point of the groove, and a maximum width D refers to the longest width among widths of the groove measured in a horizontal direction (see FIG. 4). In a case in which the maximum depth H of the groove satisfies the numerical range, pattern formation may be facilitated, and a phenomenon in which the conductive layer present within the groove may be simultaneously removed at the time of removing the conductive layer from remaining regions of the resin pattern layer, other than the grooves may be prevented.

Meanwhile, in an exemplary embodiment of the present disclosure, the maximum width D of the groove 24 may be approximately 0.1 μm to 3 μm, preferably, approximately 0.3 μm to 2 μm, more preferably, approximately 0.5 μm to 0.9 μm. In a case in which the maximum width of the groove is less than 0.1 μm, a line width of the conductive layer may be extremely narrow to result in an increase in resistance and deterioration in conductivity. In a case in which the maximum width of the groove is greater than 3 μm, the line width of the conductive layer may be increased, such that a metal line may be recognized due to the reflection of the conductive layer, thereby degrading an exterior quality of a product.

Meanwhile, as illustrated in FIG. 4(C), in a case in which the upper edge on the side surface of the groove has a rounded shape, the radius r of curvature of the upper edge may be equal to or less than 0.3 times the maximum depth H of the groove and preferably, may be approximately 0.01 times to 0.15 times the maximum depth H of the groove. In a case in which the radius of curvature of the upper edge exceeds 0.3 times the maximum depth H of the groove, a phenomenon in which the conductive layer is broken at the time of removing the conductive layer may be reduced to decrease a removal rate and uniformity.

In addition, in the resin pattern layer, a total area of bottom surfaces of the grooves may be formed to be 0.1% to 5% of the overall cross-sectional area of the resin pattern layer. In a case in which the total area of the bottom surfaces of the grooves exceeds 5% of the overall cross-sectional area of the resin pattern layer, transparency of the substrate may be degraded due to the conductive layer. In a case in which the total area of the bottom surfaces of the grooves is less than 0.1% of the overall cross-sectional area of the resin pattern layer, sufficient conductivity may not be secured.

Then, the conductive layer 30 may be formed on the resin pattern layer 20.

In this case, the conductive layer 30 may include a metal layer formed by, for example, depositing a metal such as copper, silver, gold, aluminum, nickel, brass, iron, chrome, platinum, molybdenum or an alloy thereof. Among these, the conductive layer 30 may preferably include a metal layer formed by depositing copper, aluminum, or the like in terms of economic feasibility and conductivity. Further, if necessary, the conductive layer 30 may be formed of two or more layers. For example, the conductive layer 30 may further include an adhesion controlling layer or a blackening layer on an upper portion and/or a lower portion of the metal layer containing such a metal.

Meanwhile, in an exemplary embodiment of the present disclosure, the conductive layer 30 may be formed by depositing the metal on the resin pattern layer 20. In this case, the deposition may be performed such that the average height of the conductive layer is 50% or less of the maximum depth of each of the grooves and a metal deposition angle is within a range of −15° to 15° with respect to a direction perpendicular to the resin pattern layer. In this case, the average height of the conductive layer was measured by a method of measuring heights of portions of the conductive layer from central points of the grooves (hereinafter, referred to as central heights) and calculating the average of measured values present within a deviation range of −20% to +20% from the central heights. Meanwhile, the central point of each of the grooves refers to a central portion of the bottom surface thereof in the vertical section thereof.

Preferably, the average height of the conductive layer may be approximately 5% to 50%, approximately 10% to 50%, or approximately 20% to 40%, of the maximum depth of the groove, and the metal deposition angle may be approximately −15° to 15°, approximately −10° to 10°, or approximately −5° to 5°.

According to the inventors' research, in a case in which a conductive layer is formed in grooves having a width of 3 μm or less by a conductive layer formation method generally used in the related art, that is, a sputtering method or an e-beam deposition method, portions of the conductive layer 30 present within the grooves may be removed along with the conductive layer present in the remaining regions other than the grooves during the removal of the conductive layer 30, such that short-circuits may occur. However, in a case in which a deposition height and the metal deposition angle satisfy the ranges as described above during the deposition of the conductive layer, a conductive layer having a line width of 3 μm or less may be formed without short-circuits and consequently, a substrate having excellent conductivity and transparency characteristics may be manufactured.

Meanwhile, the deposition height of the conductive layer may be controlled by adjusting a processing speed of a film, and the like. For example, in a case in which metal evaporation is performed with the same degrees of power, in other words, in a case in which an evaporation amount per unit time is constant, the deposition height may be controlled by varying the processing speed of the film. In the case of increasing the processing speed of the film, time exposed to vapor may be decreased to lower the deposition height.

Further, the metal deposition angle may be controlled by installing a mask on a deposition apparatus or adjusting a distance between an evaporation source and a base member on which the evaporation source is deposited. More specifically, a mask having openings of a predetermined width may be disposed between the evaporation source and the base member, such that only vapor moving at a desired angle may pass therethrough. Furthermore, in accordance with an increase in the distance between the evaporation source and the base member on which the evaporation source is deposited, an angle range of vapor actually arriving on the base member may be narrowed.

In a case in which the metal deposition angle is controlled as described above, a thickness of the conductive layer deposited on the side surface of the groove may be controlled. Preferably, the forming of the conductive layer according to the exemplary embodiment of the present disclosure may be performed such that the thickness of the conductive layer deposited on the side surface of the groove may be 25% or less of the average height of the conductive layer. According to the inventors' research, in a case in which the thickness of the conductive layer attached to the side surface of the groove exceeds 25%, it may be difficult to form a fine metal line having a line width of 3 μm or less without short-circuits.

Meanwhile, it may not be necessarily required, but the forming of the conductive layer 30 according to the exemplary embodiment of the present disclosure may further include forming an adhesion controlling layer 40 on the resin pattern layer 20 prior to the deposition of the metal (see FIG. 2(B)).

The adhesion controlling layer 40 may be provided to prevent oxidation of the conductive layer 30 due to the resin by separating the resin pattern layer 20 from the conductive layer 30 and be provided to facilitate delamination by adjusting adhesion between the resin pattern layer 20 and the conductive layer 30. The adhesion controlling layer 40 may be formed of at least one selected from a group consisting of a silicon oxide, a metallic oxide, molybdenum, carbon, tin, chrome, nickel and cobalt.

A thickness of the adhesion controlling layer 40 may be approximately 0.005 μm to 0.2 μm, preferably, approximately 0.005 μm to 0.1 μm, more preferably, approximately 0.01 μm to 0.06 μm. In a case in which the thickness of the adhesion controlling layer 40 is less than 0.005 μm, film formation may be inappropriately performed. Since sufficient film properties may be obtained in the case of the film thickness being 0.2 μm or less, only an increase in processing costs may be unnecessarily caused in the case of the film thickness exceeding 0.2 μm.

Meanwhile, a formation method of the adhesion controlling layer may be suitably selected depending on a material forming the adhesion controlling layer, but is not particularly limited. For example, a formation process of the adhesion controlling layer may be performed by a chemical vapor deposition method or a physical vapor deposition method and in this case, a deposition angle may be approximately −15° to 15°, approximately −10° to 10°, or approximately −5° to 5°.

Further, if necessary, in the forming of the conductive layer, forming a blackening layer may be further performed prior to and/or after the deposition of the metal.

The forming of the blackening layer may be provided to improve transparency of the transparent substrate by degrading reflectance of the conductive layer, and a blackening layer formation method commonly known in the technical field may be used without limitation.

For example, the blackening layer may be formed of at least one selected from a group consisting of a silicon oxide, a metallic oxide, molybdenum, carbon, tin, chrome, nickel and cobalt.

In addition, a thickness of the blackening layer may be approximately 0.005 μm to 0.2 μm, preferably, approximately 0.005 μm to 0.1 μm, more preferably, approximately 0.01 μm to 0.06 μm. In a case in which the thickness of the blackening layer is less than 0.005 μm, film formation may be inappropriately performed. Since sufficient film properties may be obtained in the case of the film thickness being 0.2 μm or less, only an increase in processing costs may be unnecessarily caused in the case of the film thickness exceeding 0.2 μm.

The composition and the thickness of the blackening layer may be variously adjusted depending on a desired degree of blackening. In a case in which the blackening layer is formed on both upper and lower portions of the conductive layer, an upper blackening layer and a lower blackening layer may be identical to or different from each other in terms of the composition and/or the thickness thereof. For example, in a case in which materials for forming the upper blackening layer and the lower blackening layer are different, since a degree of blackening may be varied depending on the thickness of the blackening layer, thicknesses of the upper blackening layer and the lower blackening layer may be differently configured.

Meanwhile, a formation method of the blackening layer may be suitably selected depending on a material forming the blackening layer, but is not particularly limited. For example, a formation process of the blackening layer may be performed by a chemical vapor deposition method or a physical vapor deposition method and in this case, a deposition angle may be approximately −15° to 15°, approximately −10° to 10°, or approximately −5° to 5°.

Meanwhile, a line width of the conductive layer formed through the method as described above may be approximately 0.1 μm to 3 μm, preferably, approximately 0.3 μm to 2 μm, more preferably, approximately 0.5 μm to 0.9 μm. In a case in which the line width of the conductive layer is less than 0.1 μm, the line width of the conductive layer may be extremely small to result in an increase in resistance and deterioration in conductivity. In a case in which the line width of the conductive layer is greater than 3 μm, a metal line may be recognized due to the reflection of the conductive layer, thereby degrading an exterior quality of a product.

In addition, the average height of the conductive layer may be 5% to 50% of the groove depth, for example, approximately 0.1 μm to 2 μm.

After forming the conductive layer 30 on the resin pattern layer 20 through the method as described above, remaining portions of the conductive layer 30 present in the remaining regions of the resin pattern layer 20 except for those present in the grooves 24, in other words, portions of the conductive layer attached to an external surface of the resin pattern layer 20, may be selectively removed. In this case, the removal of the conductive layer may be performed by a physical method. Here, the physical method refers to a method of removing a conductive layer using physical force and is distinguished from a method of removing the conductive layer through chemical reactions such as etching. More particularly, a process of physically removing the conductive layer may be performed by a scraping method, a detaching method or a combination thereof.

In this case, the scraping method refers to a method of scraping and removing the conductive layer. The detaching method refers to a method of separating the conductive layer from the resin pattern layer by applying tension to one end of the conductive layer. The scraping method may be used in a case in which adhesion between the conductive layer and the resin pattern layer is high. The detaching method may be used in a case in which adhesion between the conductive layer and the resin pattern layer is low. Further, the scraping method and the detaching method may be simultaneously performed in a single process, whereby a portion of the conductive layer in which adhesion thereof with the resin pattern layer is relatively high may be removed by the scraping method, while another portion of the conductive layer in which adhesion thereof with the resin pattern layer is relatively low may be removed by the detaching method. For example, as polishing is performed from an edge of an opening to another edge thereof in the substrate using a fabric having a melamine foam or a fabric having a rough surface, an edge portion of the opening having a relatively high adhesive strength may be scraped and removed, while a central portion of the opening having a relatively low adhesive strength may be removed by using tension generated when the fabric is polished thereon.

Meanwhile, in the case of removing the conductive layer using the physical method as described above, a removal process may be simplified and at the same time, may be advantageous in terms of environmentally friendly characteristics, as compared to conductive layer removal using a chemical method according to the related art. In the case of removing the conductive layer using a chemical method, the conductive layer present within the groove needs to protected through a method of inserting a separate etching-resistant material into an upper portion of the conductive layer formed within the groove or the like in order to selectively remove the conductive layer from remaining regions of the resin pattern layer, other than the conductive layer present in the grooves. In this case, since a process of inserting an etching-resistant material may be additionally required, processing costs and a product yield may be affected thereby. As compared to this, in the case of removing the conductive layer using the physical method, an additional process may be unnecessary and toxic chemical materials such as an etching solution and an etching-resistant material may not be used, thereby allowing for environmentally friendly characteristics.

In addition, in the case of using the physical method as described above, since the conductive layer may be removed through a consecutive process, productivity may be improved and manufacturing time required may be shortened.

Further, the manufacturing method of the transparent substrate including the conductive layer according to the exemplary embodiment of the present disclosure may further include planarizing the resin pattern layer after the physically removing the conductive layer (see FIG. 1(D) and FIG. 2(E)). In the case of performing the planarization, oxidation of the conductive layer may be prevented due to a planarized layer 50, scratch resistance may be improved, and light scattering caused by a resin shape may be decreased.

Meanwhile, the polarization may be performed by filling the grooves of the resin pattern layer 0 with a transparent resin composition, and a material for forming the planarized layer may be the same as or different from the material forming the resin pattern layer. Preferably, a difference in indices of refraction between a material of the planarized layer and the material forming the resin pattern layer may be 0.3 or less. In a case in which a difference in indices of refraction between the planarized layer and the resin pattern layer is increased, light may be refracted, reflected or scattered to generate haze, while light passes. Consequently, degradation in transparency may be caused.

A transparent substrate according to an exemplary embodiment of the present disclosure, manufactured by the method as described above may include a resin pattern layer including a plurality of grooves respectively including side surfaces and a bottom surface; and a conductive layer formed within the grooves, wherein a line width of the conductive layer may be approximately 0.1 µm to 3 µm, and an average height of the conductive layer may be approximately 5% to 50% of a maximum depth of each of the grooves.

Here, a maximum width of the groove may be approximately 0.1 µm to 3 µm, and the maximum depth of the groove may be approximately 0.2 times to 2 times the maximum width thereof. The side surfaces of the groove may be formed to have an angle of inclination ranging from 0° to 15°, with respect to a vertical direction. Moreover, the radius of curvature of the upper edge on the side surface of the groove may be equal to or less than 0.3 times the maximum depth of the groove. The total area of bottom surfaces of the grooves may be formed to be 0.1% to 5% of the overall cross-sectional area of the resin pattern layer.

Since a detailed description relating to the shape and the formation area of the grooves are the same as that described above, it will be omitted.

Meanwhile, the resin pattern layer may be formed of a resin commonly known in the technical field, for example, an active energy ray-curable resin, a thermosetting resin, a conductive polymer resin, or a combination thereof, and examples thereof may contain urethane acrylate, epoxy acrylate, ester acrylate, polydimethylsiloxane, polyacetylene, polyparaphenylene, polyaniline, polypyrrole, and the like.

Meanwhile, in the transparent substrate according to an exemplary embodiment of the present disclosure, the conductive layer may include a metal layer containing copper, silver, aluminum, nickel, chrome, platinum, or an alloy thereof. Further, the conductive layer may be formed of two or more layers including another layer on an upper portion and/or a lower portion of the metal layer. For example, the conductive layer may further include an adhesion controlling layer on the lower portion of the metal layer, and a blackening layer may be further provided on the upper portion and/or the lower portion of the metal layer, if necessary. Since detailed description relating to the metal layer, the adhesion controlling layer and the blackening layer is the same as that as described above, it will be omitted.

Meanwhile, the average height of the conductive layer may be preferably, approximately 0.01 µm to 2 µm, and the line width of the conductive layer may be approximately 0.1 µm to 3 µm, preferably, approximately 0.3 µm to 2 µm, more preferably, approximately 0.5 µm to 0.9 µm. In a case in which the height of the conductive layer satisfies the numerical range, the conductive layer having a line width of 3 µm or less may be formed without short-circuits, and accordingly, a substrate having excellent conductivity and transparency characteristics may be manufactured.

In addition, in the transparent substrate according to an exemplary embodiment of the present disclosure, a thickness of the conductive layer attached to the side surfaces of the groove may be 25% or less of the average height of the conductive layer. As described above, in a case in which the thickness of the conductive layer attached to the side surfaces of the groove exceeds 25%, a portion of the conductive layer present within the groove may be removed along with the conductive layer present in the remaining regions of the resin pattern layer, such that short-circuits may easily occur. Here, the thickness of the conductive layer attached to the side surface of the groove refers to a vertical distance from the side surface of the groove to an outermost surface of the conductive layer.

In the transparent substrate according to the exemplary embodiment of the present disclosure, manufactured as described above, areas $S_1$ and $S_2$ of the conductive layer attached to the side surfaces of the groove and area $S_0$ of the conductive layer attached to the bottom surface of the groove may preferably satisfy the following Equations 1 and 2 or Equations 3 and 4.

More particularly, in the transparent substrate according to an exemplary embodiment of the present disclosure, when an absolute value of an angle of inclination of one side surface of the groove with respect to the vertical direction is denoted by $\theta_1$ and an absolute value of an angle of inclination of another side surface of the groove with respect to the vertical direction is denoted by $\theta_2$, in the case of tan $\theta1$+tan $\theta2=0$, that is, in a case in which the side surfaces of the groove have no angle of inclination, the vertical section of the conductive layer may preferably satisfy the following Equations 1 and 2:

$$0 \leq S_1 D^2/(S_0 HD - S_0^2) \leq 0.3 \quad \text{[Equation 1]}$$

$$0 \leq S_2 D^2/(S_0 HD - S_0^2) \leq 0.3 \quad \text{[Equation 2]}$$

in Equations 1 and 2, H is the maximum depth of the groove, and D is the maximum width of the groove. Definitions regarding the maximum depth and the maximum width of the groove are the same as those described above.

Meanwhile, area $S_0$ refers to a cross-sectional area of the conductive layer disposed below reference line 1, and each of areas $S_1$ and $S_2$ refers to a cross-sectional area of the conductive layer attached to one side surface of the groove among portions of the conductive layer disposed above reference line 1 (see. FIG. 9). In this case, when an average height of the conductive layer is defined as h, reference line 1 refers to a horizontal line passing through a point disposed at a height of 1.2h from a central point C of the groove. The definition of the average height of the conductive layer is the same as that as described above.

Meanwhile, in the transparent substrate according to an exemplary embodiment of the present disclosure, when an absolute value of an angle of inclination of one side surface of the groove with respect to the vertical direction is denoted by $\theta_1$ and an absolute value of an angle of inclination of another side surface of the groove with respect to the vertical direction is denoted by $\theta_2$, in the case of tan $\theta_1$+tan $\theta_2>0$, that is, in a case in which at least one of the side surfaces of the groove has an angle of inclination, the vertical section of the conductive layer may preferably satisfy the following Equations 3 and 4:

$$0 \leq S_1(\tan \theta_1+\tan \theta_2)\cos \theta_1/[\{2D-H(\tan \theta_1+\tan \theta_2)\}T_0 - 2S_0] \leq 0.3 \quad \text{[Equation 3]}$$

$$0 \leq S_2(\tan \theta_1+\tan \theta_2)\cos \theta_2/[\{2D-H(\tan \theta_1+\tan \theta_2)\}T_0 - 2S_0] \leq 0.3, \quad \text{[Equation 4]}$$

in Equations 3 and 4, $T_0$ is a value defined by the following [Equation 5]

$$T_0 = [H(\tan \theta_1+\tan \theta_2)-D+\{(D-H(\tan \theta_1+\tan \theta_2))^2 + 2S_0(\tan \theta_1+\tan \theta_2)\}^{0.5}]/(\tan \theta_1+\tan \theta_2), \quad \text{[Equation 5]}$$

The definitions of H, D, $S_0$ $S_1$ and $S_2$ are the same as those in Equations 1 and 2.

According to the inventors' research, in a case in which the conductive is formed to satisfy the above described Equations, even in the case of a fine line width of 3 μm or less, the conductive layer present within the groove may not delaminate and remain therein, such that a transparent substrate having a superior degree of recognition while securing sufficient conductivity may be obtained.

Meanwhile, the transparent substrate according to an exemplary embodiment of the present disclosure may further include a planarized layer on an upper portion of the conductive layer, and this case, the planarized layer may be formed of a material having an index of refraction different from that of the material forming the resin pattern layer by 0.3 or less.

Meanwhile, the transparent substrate according to the exemplary embodiment of the present disclosure may have an opening ratio of approximately 95% to 99.9% and sheet resistance of approximately 0.01Ω/□ to 100Ω/□ and exhibit superior transparency and conductivity characteristics.

In this case, the opening ratio refers to an area percentage of a region in which the conductive layer is not formed in a surface area of the transparent substrate, and may be calculated as {(cross-sectional area of surface of transparent substrate–the sum of areas of conductive layer formation portions)/cross-sectional area of surface of transparent substrate}×100. In the transparent substrate according to an exemplary embodiment of the present disclosure, since the line width of the conductive layer is small and the opening rate is high, deterioration in exterior quality caused by the reflection of the conductive layer may be significantly reduced and excellent transparency may be provided.

Meanwhile, the transparent substrate according to the exemplary embodiment of the present disclosure may be used in all fields of application to which a conductive substrate is employed and for example, may be usefully employed in touch panels, electrodes for organic solar cells, transparent OLEDs, electromagnetic wave-shielding films, heating wire glass, flexible substrates and the like. FIG. 5 is images obtained by imaging the transparent substrate according to an exemplary embodiment of the present disclosure, using an optical microscope. As illustrated in FIG. 5, since the transparent substrate according to the exemplary embodiment of the present disclosure may have a narrow line width in the conductive layer, a deterioration in transparency due to the reflection of the conductive layer may be significantly reduced and consequently, the transparent substrate may have a high degree of transparency, thereby being suitable for use in the fields of displays such as touch panels or transparent OLEDs.

Mode For Disclosure

Hereinafter, exemplary embodiments of the present disclosure will be described in detail through concrete examples.

INVENTIVE EXAMPLE

After applying an urethane-acrylate resin composition to a polyethylene terephthalate base member having a thickness of 50 μm, a mold was used to form a resin pattern layer in which grooves having reversed trapezoidal shapes in vertical sections thereof were arranged in a lattice manner, a maximum width D of the grooves being 1.0 μm, a maximum depth H of the grooves being 0.5 μm, and angles of inclination of both side surfaces of the grooves being 5 degrees with respect to a vertical direction in the reversed trapezoidal cross-sections. In this case, an interval between the grooves was 100 μm.

Then, a copper metal was deposited on the resin pattern layer at a deposition angle of −5 to +5 degrees, using a roll-to-roll electron beam evaporation apparatus on which a mask is installed, manufactured by the ULVAC company. In this case, an average height of a copper layer deposited on bottom surfaces of the grooves was 0.2 μm, and a thickness of the copper layer deposited on the side surfaces of the grooves was 5 nm or less.

After the completion of deposition, the conductive layer present in remaining regions other than the grooves was removed using sunfoam P3000 manufactured by the Sun abrasives Co., Ltd, as a fabric having a rough surface, to thereby manufacture a transparent substrate. In a copper layer present within the grooves of the transparent substrate manufactured as above, an area of the conductive layer formed below a reference line, that is, area $S_0$ was 0.2 μm$^2$, and the conductive layer formed above the reference line was not confirmed.

COMPARATIVE EXAMPLE 1

A transparent substrate was manufactured using the same method as that of Inventive Example, with the exception that a deposition thickness of the copper metal was 0.5 μm.

COMPARATIVE EXAMPLE 2

After applying an urethane-acrylate resin composition to a polyethylene terephthalate base member having a thickness of 50 μm, a mold was used to form a resin pattern layer in which grooves having reversed trapezoidal shapes in vertical sections thereof were arranged in a lattice manner, a maximum width D of the grooves being 1.0 μm, a maximum depth H of the grooves being 0.5 μm, and angles of inclination of both side surfaces of the grooves being 5 degrees with respect to a vertical direction in the reversed trapezoidal cross-sections. In this case, an interval between the grooves was 100 μm.

Then, a copper metal was deposited on the resin pattern layer at a deposition angle of −5 to +5 degrees, using a roll-to-roll electron beam evaporation apparatus on which a mask is not installed, manufactured by the ULVAC company. In this case, an average height of a copper layer deposited on bottom surfaces of the grooves was 0.2 μm, and a thickness of the copper layer deposited on the side surfaces of the grooves was 80 nm or less.

After the completion of deposition, the conductive layer present in remaining regions other than the grooves was removed using sunfoam P3000 manufactured by the Sun abrasives Co., Ltd, as a fabric having a rough surface, to thereby manufacture a transparent substrate.

EXPERIMENTAL EXAMPLE 1

Whether or not Short-circuits Occur

The transparent substrates manufactured according to Inventive Example and Comparative Examples 1 and 2 were imaged by using a scanning electron microscope (SEM) to observe whether or not short-circuits occurred in the conductive layers thereof. FIGS. 6 to 8 are images obtained by imaging the transparent substrates manufactured according to Inventive Example and Comparative Examples 1 and 2. FIGS. 6(A) and 6(B) are images obtained by imaging the substrate according to Inventive Example, while changing an angle and a magnification of the microscope. FIG. 7 is an image obtained by imaging the transparent substrate according to Comparative Example 1. FIG. 8 is an image obtained by imaging the transparent substrate according to Comparative Example 2. Referring to FIG. 6, it could be confirmed that in the case of the substrate manufactured according to the exemplary embodiment of the present disclosure, the conductive layer present within the grooves was uniformly formed even after the removal of the conductive layer present in the remaining regions except for the grooves. On the other hand, as illustrated in FIG. 7, in the case of the substrate according to Comparative Example 1, it could be confirmed that the conductive layer present within the grooves was removed along with the conductive layer present in the remaining regions except for the grooves at the time of the removal of the conductive layer. In addition, as illustrated in FIG. 8, in the case of the substrate according to Comparative Example 2, it could be confirmed that a portion of the conductive layer present within the grooves partially delaminated.

EXPERIMENTAL EXAMPLE 2

Measurement of Conductivity

Resistance values of the transparent substrates manufactured by Inventive Example and Comparative Examples 1 and 2 were measured by using a Fluke 117 Multi-meter manufactured by the Fluke Company. Measured results are described in the following Table 1.

TABLE 1

| Classification | Resistance value |
| --- | --- |
| Inventive Example | ~17.2 Ω/□ |
| Comparative Example 1 | non-conductive |
| Comparative Example 2 | non-conductive |

Reference Numerals

10: Transparent Substrate
20: Resin Pattern Layer
24: Grooves
30: Conductive Layer
40: Adhesion Controlling Layer
50: Planarized Layer
60: Fine Particles

The invention claimed is:
1. A manufacturing method of a transparent substrate, comprising:
forming a resin pattern layer including a plurality of grooves respectively including a side surface and a bottom surface;
forming a conductive layer by depositing a metal on the resin pattern layer, while an average height of the conductive layer is controlled to be 5% to 50% of a maximum depth of each of the grooves and a metal deposition angle is controlled to be within a range of

−15° to 15° with respect to a direction of a normal line of the resin pattern layer; and physically removing the conductive layer from remaining regions of the resin pattern layer, other than portions of the conductive layer present in the grooves, by a method of polishing and removing the conductive layer using a melamine foam or a fabric having a rough surface.

2. The manufacturing method of claim 1, wherein a maximum width of the groove is 0.1 µm to 3 µm, and the maximum depth of the groove is 0.2 times to 2 times the maximum width of the groove.

3. The manufacturing method of claim 1, wherein the side surface of the groove has an angle of inclination ranging from 0° to 15°, with respect to a vertical direction.

4. The manufacturing method of claim 1, wherein a radius of curvature of an upper edge on the side surface of the groove is equal to or less than 0.3 times the maximum depth of the groove.

5. The manufacturing method of claim 1, wherein a total area of bottom surfaces of the grooves is 0.1% to 5% of an overall cross-sectional area of the resin pattern layer.

6. The manufacturing method of claim 1, wherein the forming of the resin pattern layer including the plurality of grooves is performed by an imprinting method, a photolithography method, or an electron beam lithography method.

7. The manufacturing method of claim 1, wherein the forming of the conductive layer is performed such that a thickness of the conductive layer deposited on the side surface of the groove is 25% or less of the average height of the conductive layer.

8. The manufacturing method of claim 1, wherein the forming of the conductive layer further includes forming an adhesion controlling layer on the resin pattern layer prior to the deposition of the metal.

9. The manufacturing method of claim 8, wherein the forming of the adhesion controlling layer is performed by a chemical vapor deposition method or a physical vapor deposition method.

10. The manufacturing method of claim 1, wherein the forming of the conductive layer further includes forming a blackening layer.

11. The manufacturing method of claim 10, wherein the forming of the blackening layer is performed by a chemical vapor deposition method or a physical vapor deposition method.

12. The manufacturing method of claim 1, further comprising:
planarizing the resin pattern layer after the physically removing the conductive layer.

13. The manufacturing method of claim 11, wherein the forming of the blackening layer is performed such that a deposition angle is within a range of −15° to 15° with respect to the direction of the normal line of the resin pattern layer.

14. The manufacturing method of claim 1, wherein the forming of the adhesion controlling layer is performed such that a deposition angle is within a range of −15° to 15° with respect to the direction of the normal line of the resin pattern layer.

15. A manufacturing method of a transparent substrate, comprising:
forming a resin pattern layer including a plurality of grooves respectively including a side surface and a bottom surface;
forming a conductive layer by:
forming an adhesion controlling layer on the resin pattern layer such that a deposition angle is within a range of −15° to 15° with respect to the direction of the normal line of the resin pattern layer; and
depositing a metal on the adhesion controlling layer on the resin pattern layer, while an average height of the conductive layer is controlled to be 5% to 50% of a maximum depth of each of the grooves and a metal deposition angle is controlled to be within a range of −15° to 15° with respect to a direction of a normal line of the resin pattern layer; and
physically removing the conductive layer from remaining regions of the resin pattern layer, other than portions of the conductive layer present in the grooves.

16. The manufacturing method of claim 15, wherein a maximum width of the groove is 0.1 µm to 3 µum, and the maximum depth of the groove is 0.2 times to 2 times the maximum width of the groove.

17. The manufacturing method of claim 15, wherein the side surface of the groove has an angle of inclination ranging from 0° to 15°, with respect to a vertical direction.

18. The manufacturing method of claim 15, wherein a radius of curvature of an upper edge on the side surface of the groove is equal to or less than 0.3 times the maximum depth of the groove.

19. The manufacturing method of claim 15, wherein a total area of bottom surfaces of the grooves is 0.1% to 5% of an overall cross-sectional area of the resin pattern layer.

20. The manufacturing method of claim 15, wherein the forming of the resin pattern layer including the plurality of grooves is performed by an imprinting method, a photolithography method, or an electron beam lithography method.

21. The manufacturing method of claim 15, wherein the forming of the conductive layer is performed such that a thickness of the conductive layer deposited on the side surface of the groove is 25% or less of the average height of the conductive layer.

22. The manufacturing method of claim 15, wherein the physically removing the conductive layer is performed by a scraping method, a detaching method or a combination thereof.

23. The manufacturing method of claim 15, wherein the physically removing the conductive layer is performed by a method of polishing and removing the conductive layer, using a melamine foam or a fabric having a rough surface.

24. The manufacturing method of claim 15, wherein the forming of the conductive layer further includes forming a blackening layer by a chemical vapor deposition method or a physical vapor deposition method.

25. The manufacturing method of claim 24, wherein the forming of the blackening layer is performed such that a deposition angle is within a range of −15° to 15° with respect to the direction of the normal line of the resin pattern layer.

26. The manufacturing method of claim 15, further comprising planarizing the resin pattern layer after physically removing the conductive layer.

27. A manufacturing method of a transparent substrate, comprising:
forming a resin pattern layer including a plurality of grooves respectively including a side surface and a bottom surface;
forming a conductive layer by:
depositing a metal on the resin pattern layer, while an average height of the conductive layer is controlled to be 5% to 50% of a maximum depth of each of the grooves and a metal deposition angle is controlled to be within a range of −15° to 15° with respect to a direction of a normal line of the resin pattern layer; and forming a blackening layer by a chemical vapor deposition method or a physical vapor deposition method, wherein the forming of the blackening layer is performed such that a deposition angle is within a range of −15° to 15° with respect to the direction of the normal line of the resin pattern layer; and physically removing the conductive layer from remaining regions of the resin pattern layer, other than portions of the conductive layer present in the grooves.

28. The manufacturing method of claim 27, wherein a maximum width of the groove is 0.1 μm to 3 μm, and
the maximum depth of the groove is 0.2 times to 2 times the maximum width of the groove.

29. The manufacturing method of claim 27, wherein the side surface of the groove has an angle of inclination ranging from 0° to 15°, with respect to a vertical direction.

30. The manufacturing method of claim 27, wherein a radius of curvature of an upper edge on the side surface of the groove is equal to or less than 0.3 times the maximum depth of the groove.

31. The manufacturing method of claim 27, wherein a total area of bottom surfaces of the grooves is 0.1% to 5% of an overall cross-sectional area of the resin pattern layer.

32. The manufacturing method of claim 27, wherein the forming of the resin pattern layer including the plurality of grooves is performed by an imprinting method, a photolithography method, or an electron beam lithography method.

33. The manufacturing method of claim 27, wherein the forming of the conductive layer is performed such that a thickness of the conductive layer deposited on the side surface of the groove is 25% or less of the average height of the conductive layer.

34. The manufacturing method of claim 27, wherein the physically removing the conductive layer is performed by a scraping method, a detaching method or a combination thereof.

35. The manufacturing method of claim 27, wherein the physically removing the conductive layer is performed by a method of polishing and removing the conductive layer, using a melamine foam or a fabric having a rough surface.

36. The manufacturing method of claim 27, wherein the forming of the conductive layer further includes forming an adhesion controlling layer on the resin pattern layer prior to the deposition of the metal, wherein the forming of the adhesion controlling layer is performed by a chemical vapor deposition method or a physical vapor deposition method.

37. The manufacturing method of claim 27, wherein the forming of the adhesion controlling layer is performed such that a deposition angle is within a range of −15° to 15° with respect to the direction of the normal line of the resin pattern layer.

38. The manufacturing method of claim 27, further comprising planarizing the resin pattern layer after physically removing the conductive layer.

* * * * *